(12) United States Patent
Mills (10) Patent No.: US 8,238,981 B2
(45) Date of Patent: Aug. 7, 2012

(54) MANAGING POWER SUPPLY TRANSIENTS

(75) Inventor: Michael James Mills, Austin, TX (US)

(73) Assignee: Javelin Semiconductor, Inc., Austin, TX (US)

(*) Notice: Subject to any disclaimer, the term of this patent is extended or adjusted under 35 U.S.C. 154(b) by 302 days.

(21) Appl. No.: 12/627,455

(22) Filed: Nov. 30, 2009

(65) Prior Publication Data

US 2011/0128076 A1 Jun. 2, 2011

(51) Int. Cl.
*H04B 1/38* (2006.01)
(52) U.S. Cl. .......... 455/574; 455/127.1; 455/127.2; 455/126; 455/69; 455/341; 320/127
(58) Field of Classification Search .......... 455/574, 455/127.2, 126, 127.1, 69, 341; 320/127
See application file for complete search history.

(56) References Cited

U.S. PATENT DOCUMENTS

| | | | | |
|---|---|---|---|---|
| 6,018,232 | A * | 1/2000 | Nelson et al. | 320/127 |
| 6,871,050 | B2 * | 3/2005 | Wahl | 455/127.2 |
| 2002/0028701 | A1 * | 3/2002 | Satoh et al. | 455/574 |
| 2008/0139146 | A1 * | 6/2008 | Behzad | 455/127.2 |

* cited by examiner

*Primary Examiner* — Sanh Phu
(74) *Attorney, Agent, or Firm* — Trop, Pruner & Hu, P.C.

(57) ABSTRACT

In one embodiment, an apparatus includes a voltage regulator, an amplifier, and control logic. The regulator may receive a supply voltage and output a regulated voltage to an intermediate node. In turn, the amplifier is to be powered by the regulated voltage, while the control logic is coupled to the voltage regulator to cause a change in the regulated voltage to a safe voltage before one or more gain stages of the amplifier is to be coupled to or decoupled from an output signal path.

20 Claims, 8 Drawing Sheets

FIG. 8

MANAGING POWER SUPPLY TRANSIENTS

BACKGROUND

In many integrated circuits (ICs), multiple components are powered from a voltage supply, which may be at a supply voltage level, e.g., $V_{DD}$. Because there can be multiple devices in the IC, if the voltage at a node coupled between two devices is below a certain level, the first device may be damaged. Where the node voltage is above another level, the second device can be damaged. Note that the damage may not cause a catastrophic failure but instead may be a reliability issue so that lifetime of the product is compromised.

In addition, for many components of an IC, this $V_{DD}$ level is large enough to damage the components. To enable specific devices/circuits on the chip to be powered from a lower level voltage, various voltage regulators or converters may be present. Such regulator circuits can be specifically designed to protect other circuitry with given functionality and having a maximum voltage level less than the supply voltage, $V_{MAX} < V_{DD}$.

Common implementations of such a circuit may include a switching (lossless) power converter, either synchronous or asynchronous, a linear regulator or a low-dropout linear regulator (LDO). In certain ICs an LDO can be used to protect a variety of circuits. As circuits that are coupled to receive a regulated voltage, $V_{reg}$, perform their tasks, they draw variable amounts of current from $V_{DD}$. For any non-perfect controller in the regulator this means that $V_{reg}$ is imperfectly regulated.

In other words, changes in the load circuitry can cause glitches on $V_{reg}$. For example, instantaneous jumps in the amount of quiescent current drawn from the supply can cause glitches. Many ICs include or are coupled to a significant capacitor on the $V_{reg}$ node. In a typical LDO design, this capacitor supplies instantaneous current demands, thus smoothing out the glitches. For example, to smooth out glitches this capacitor may need to be on the order of microfarads (g), which may be far too large to implement on chip for many IC designs. Thus, this capacitance either consumes significant on-chip real estate, or if implemented off-chip, costs a pin of the IC and increases a bill of materials.

SUMMARY OF INVENTION

According to one aspect, the present invention is directed to an apparatus including a voltage regulator, an amplifier, and control logic. The regulator may receive a supply voltage and output a regulated voltage to an intermediate node. In turn, the amplifier is to be powered by the regulated voltage, while the control logic is coupled to the voltage regulator to cause the voltage regulator to change the regulated voltage from a first voltage to a safe voltage before one or more gain stages of the amplifier is to be coupled to or decoupled from an output signal path. That is, the amplifier may include multiple gain stages that can each be controllable to be switched on or off during a transmission mode, based on a desired power level.

The control logic may receive a mode select signal from a transceiver coupled to the amplifier and in response generate a control signal to cause the voltage regulator to change the regulated voltage. Then the control logic can generate a control signal to cause the amplifier to change the number of gain stages coupled to the output signal path.

Another aspect of the present invention is directed to a method for handling a change in operation of a circuit powered by a voltage regulator. The method includes determining whether the circuit will have a change in operating state that causes a change in current consumption, and if so a regulated voltage can be changed from a first value to a second value. After this change, the circuit may be enabled to change its operating state. In turn, this causes a change to the regulated voltage. Then, the regulated voltage can be returned to its original value. As one example, the circuit may be an output stage of a power amplifier. A mode select signal received in power amplifier logic may be used to determine that a change in operating state is to occur.

Yet another aspect is directed to a system such as a mobile terminal that includes a transceiver and a power amplifier, among other such components. The transceiver may be used to communicate a radio frequency (RF) signal to the power amplifier and send a mode select signal to the amplifier to cause RF transmission at a desired level. In turn, the amplifier may include a voltage regulator and gain stages to be powered by the regulated voltage, where each of the gain stages is controllable to be switched on or off during a transmission mode. In addition, control logic may be coupled to the voltage regulator to cause the regulator to change the regulated voltage before one or more of the gain stages is to be switched on or off. To aid in maintaining a safe voltage a first clamp device can be coupled in parallel to the voltage regulator and a second clamp device coupled in parallel to the gain stages.

DETAILED DESCRIPTION

In various embodiments, power sequencing can be used to absorb glitches that can occur during transient conditions. In this way, circuitry coupled to a node that suffers a glitch can be protected from a harmful voltage level. While embodiments may be used to protect various circuitry, for ease of illustration, examples described herein are with regard to a power amplifier (PA), and more particularly to a power amplifier including multiple gain stages to amplify an incoming RF signal to an amplified value. In such a PA, a regulator can be used to provide a voltage to a series of active power amplifiers of a gain stage that may be turned on and off to adjust drive strength. These gain stages may be powered by a regulated voltage, e.g., provided from a LDO regulator that in turn is coupled to a supply voltage.

In the examples described herein, power sequencing may be used to maintain the voltage at the regulated node within a range that is safe for both the LDO regulator and the gain stages. However, it is to be understood that embodiments can be used with many different types of circuits to provide power sequencing to enable maintaining a given voltage node within a safe range such that various circuitry coupled to the node is not damaged.

In general, in the context of a PA glitch directions may occur as follows. When a gain stage is turned on, an increase in current occurs. This in turn causes a decrease in $V_{reg}$. Over time, the LDO adjusts accordingly, and $V_{reg}$ increases, e.g., to its original value. Instead when a gain stage is turned off, a decrease in current occurs. This in turn causes an increase in $V_{reg}$. Over time, the LDO adjusts accordingly, and $V_{reg}$ decreases, e.g., to its original value.

Figure 1:
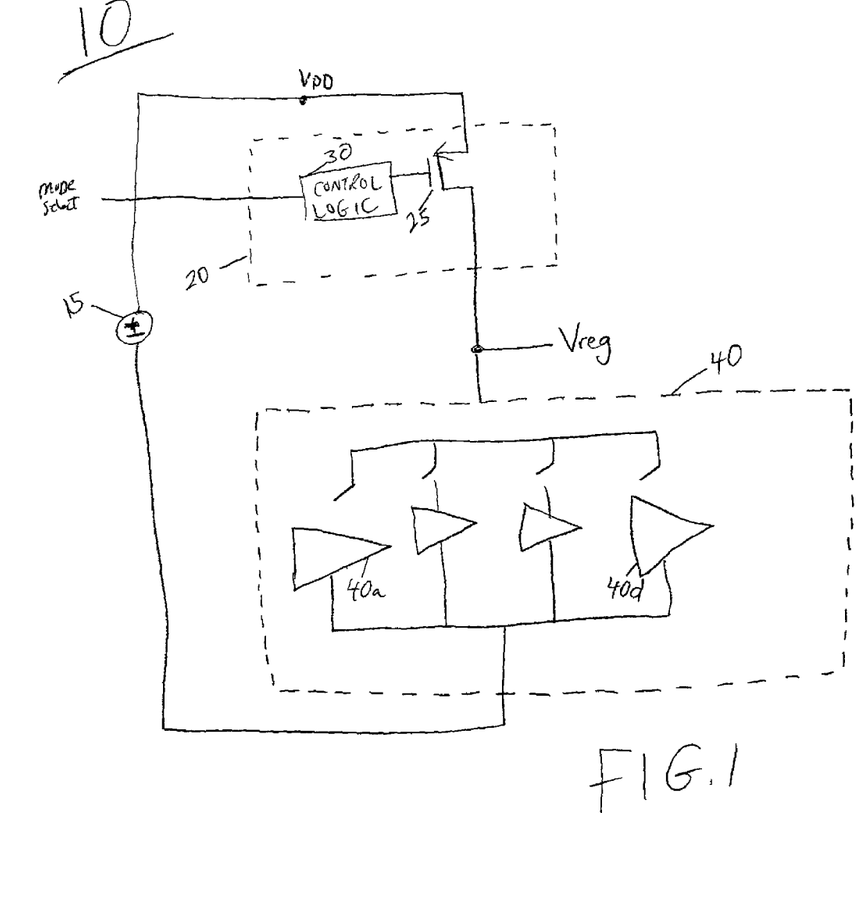
FIG. 1 is a schematic diagram of a portion of a power amplifier (PA) in accordance with an embodiment of the present invention.

Referring now to FIG. 1, shown is a schematic diagram of a portion of a PA in accordance with an embodiment of the present invention. As shown in FIG. 1, PA 10 is shown with relatively limited components. Specifically, PA 10 includes a voltage regulator 20 which in various embodiments may be an LDO regulator, switching regulator or other power converter such as a switching power converter. For ease of illustration, regulator 20 is shown as an LDO including a pass device 25. In the embodiment of FIG. 1 the pass device is a metal oxide semiconductor field effect transistor (MOSFET), namely a p-channel MOSFET (PMOS) device having a source terminal coupled to a supply voltage (i.e., $V_{DD}$), and a drain terminal coupled to an output of the voltage regulator, i.e., a regulated voltage node, also referred to herein as an intermediate voltage node. In one embodiment, pass device 25 may be a high powered device. As an example, this pass transistor may be a 1.8 volt device that drives a constraint on the minimum voltage for the regulated voltage node. As further seen in FIG. 1, LDO regulator 20 may include a control logic 30 which may be implemented using digital circuitry to receive incoming control signals and to control an analog LDO controller (not shown in FIG. 1) that in turn controls a gate voltage to PMOS device 25. Of course, this logic may be separate from the regulator in many implementations.

Referring still to FIG. 1, a circuit to be powered by the regulated voltage is represented as an amplifier 40, which may include a plurality of gain stages 40a-40d. While shown with only four gain stages, understand the scope of the present invention is not limited in this regard. In the embodiment of FIG. 1, each gain stage 40 may be selectively switched into or out of a signal path that receives an incoming signal, e.g., an RF signal and amplifies it to a desired power level for output from PA 10 via an output signal path. As seen, the various gain stages may be powered by the regulated voltage.

As further shown in FIG. 1, the supply voltage provided to LDO 20 may be from a voltage source 15, which may be an off-chip voltage source such as a battery voltage source, e.g., a battery voltage of a cellular telephone or other portable wireless device. While shown with this particular implementation in the embodiment of FIG. 1, the scope of the present invention is not limited in this regard.

When a component, e.g., a transceiver or a baseband processor coupled to the PA seeks to change an operation mode of the PA, a mode select signal is received from the component, e.g., via an input pin of the PA. Once this mode select signal is received, there may be a predetermined amount of time before the PA is to transmit power at a different level. In this time, a series of delayed events may allow various circuitry of the PA to progress to be ready for that new mode. As an example, this time may be 10 microseconds.

In one embodiment, when the mode select signal is received, a logic of the PA may generate a control signal to indicate that the PA is not ready to transmit power and to cause a regulated voltage to be changed to a safe voltage. After a predetermined time, the value of the control signal may change to indicate that the PA is ready for the new transmission mode, e.g., to initiate a transmission at a predetermined level by causing the regulated voltage to return to a normal value.

Figure 2:
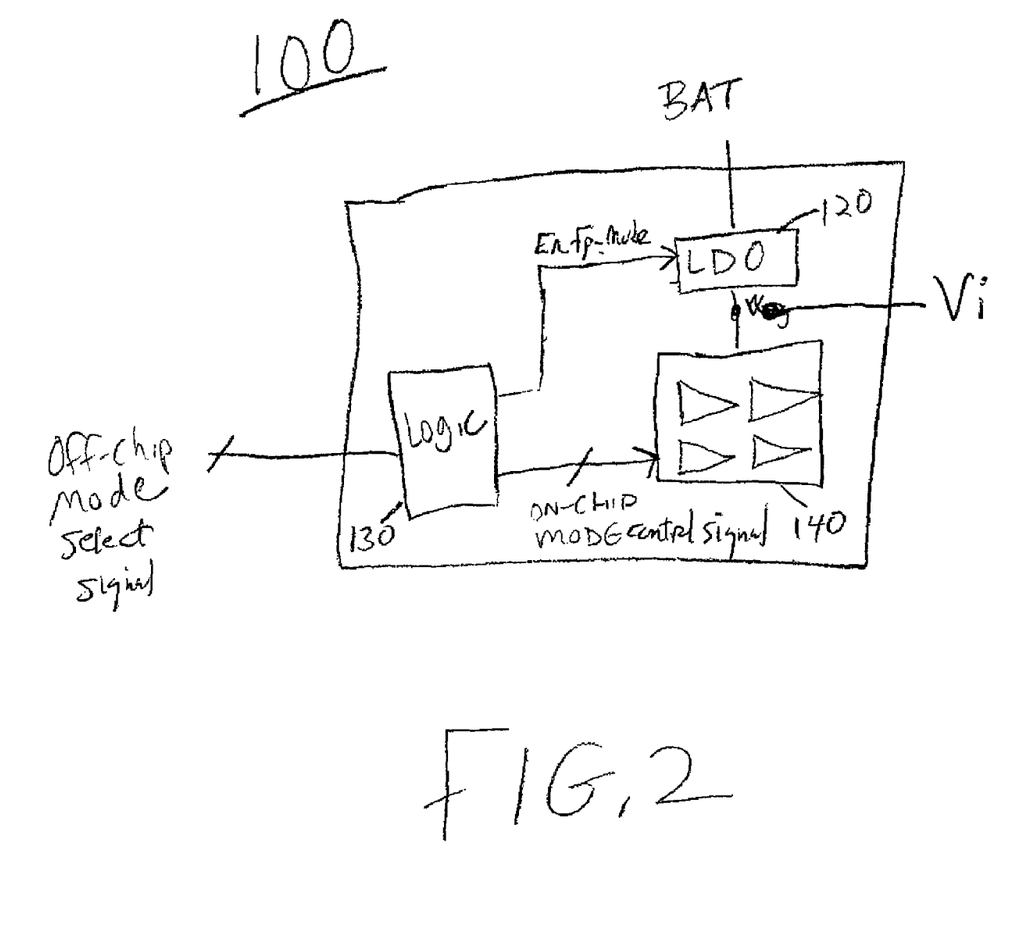
FIG. 2 is a block diagram of a PA in accordance with another embodiment of the present invention.

Referring now to FIG. 2, shown is a block diagram of a PA in accordance with another embodiment of the present invention. PA 100 is shown with relatively few components to illustrate the various features disclosed herein. Specifically as seen in FIG. 2, a logic 130 may be coupled to receive an off-chip mode select signal. This signal may be a multi-bit signal, where each different value may correspond to a power level to be output by the PA. While the scope of the present invention is not limited in this regard, in some embodiments a PA may provide for a plurality of power modes. For example, six different power modes may be available, and which can be controlled by switching a selected number and size of gain stages. For example, a PA may include multiple signal paths, e.g., a medium power path and a high power path, each including one or more gain stages that in turn can be coupled to an output signal path.

Responsive to this mode select signal, logic 130 may cause a control signal (En_Fp_Mode) to be sent to LDO 120. More specifically, this control signal may cause LDO 120 to change its output voltage level to a safe voltage to thus accommodate glitches that may occur when switching one or more gain stages of amplifier 140 into or out of the output signal path. Thus after LDO 120, which is coupled to receive a battery voltage ($V_{batt}$), changes its output voltage to the safe voltage level, logic 130 may send an on-chip mode control signal to amplifier 140 to thus switch in/switch out one or more gain stages with respect to the output signal path. This change causes a change in current consumption as discussed above, which in turn causes a voltage glitch at the intermediate voltage node ($V_i$) coupled between LDO 120 and amplifier 140. Note that whether the glitch is upward or downward is dependent on the net change in stages (i.e., net power output change). For example, an "up" glitch can still occur even when stages are turned on, as long as more stages are turned off. As one example, if one stage is turned on, and two other stages are turned off, the net result is still a decrease in current, resulting in an "up" glitch. When this glitch passes, logic 130 may switch the control signal to LDO 120 to cause the voltage to return to its normal level. Accordingly, at this time PA 100 is ready to transmit information at a new power level according to the received off-chip mode select signal. Note that while shown with this particular implementation with respect to FIG. 2, the scope of the present invention is not limited in this regard.

In one example implementation, LDO 120 may have a maximum voltage across it of 1.8V ($V_{MAX}$ equals 1.8V) and the gain stages of amplifier 140 coupled to the regulator output may have a $V_{MAX}$ of 3.8 V. In this example, $V_{DD}$ may correspond to a typical lithium-ion (Li-on) battery for a mobile station, and may be at 4.2V. This implies that the voltage at the output of the regulator should be maintained between 2.4 and 3.8V at all times.

Since in this example the regulated voltage is to be maintained in the range between 2.4V and 3.8V, a safe voltage can be selected to use during transients. This safe voltage may be such that during transient operation (e.g., when a transient current is present) that causes a substantially instantaneous change in a voltage level of the regulator output, this level may still be within a range such that multiple circuits or devices coupled to this voltage remain in a voltage range below their maximum operating voltage. This voltage range in which multiple components coupled to a node can operate in a range below a maximum operating voltage and above a minimum operating voltage is refereed to herein as an allowable voltage range. In some embodiments, the safe voltage may be selected to be substantially halfway in between the range of allowable voltages. For the example devices above, a safe voltage of 3.1V may be selected (i.e., halfway between 2.4 and 3.8V).

Figure 3:
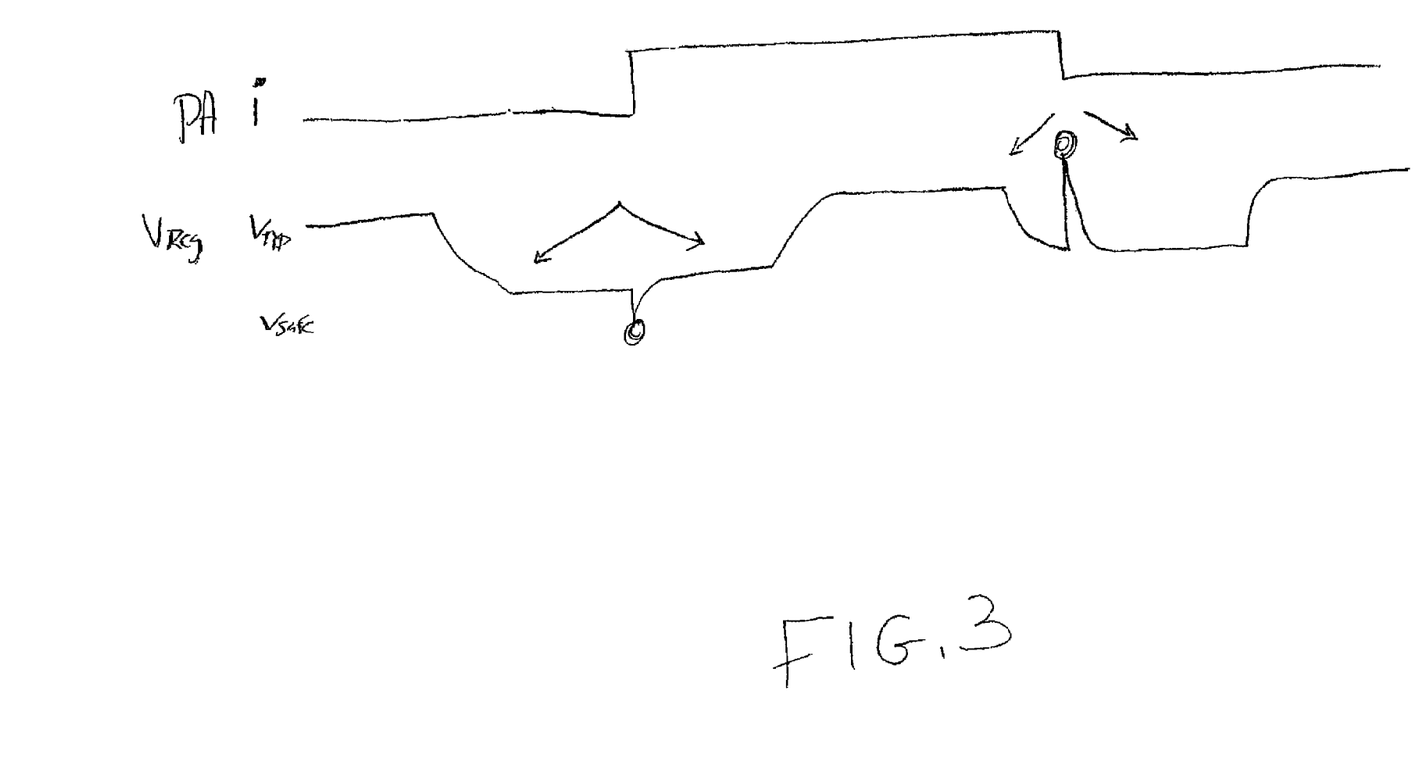
FIG. 3 is a graphical illustration of a voltage level at a regulated voltage node in accordance with an embodiment of the present invention.

Referring now to FIG. 3, shown is a graphical illustration of a voltage level at a regulated voltage node in accordance with an embodiment of the present invention. As seen in FIG. 3, the regulated voltage node may operate at a typical voltage of, e.g., 3.8 volts (V). With reference to the example discussed above, this $V_{reg}$ of 3.8V also corresponds to the maximum safe voltage at which the devices can operate (although there may be some leeway in that the maximum safe voltage may be slightly higher). Accordingly, embodiments may power sequence the voltage regulator or other circuitry to ensure that the regulated voltage node be maintained at a level within the safe range of 2.4V-3.8V, even in the presence of glitches.

As seen in FIG. 3, during operation of the PA at a first level, the regulated voltage node is at the 3.8V level of typical operation. Then prior to a mode change in which one or more additional gain stages may be powered on, this regulated voltage node is transitioned to a safe voltage. In the embodiment shown in FIG. 3, control logic or another control mechanism can cause the voltage node to be charged down to a safe voltage of 3.1V. As seen, this charging down may occur before the one or more additional gain stages is powered on.

When this power on occurs such that additional current is consumed by these gain stages, the voltage of the regulated node drops substantially instantaneously as a downward glitch as seen in FIG. 3. Note that to maintain safe operation, it is to be ensured that as a result of this downward glitch, the regulated voltage node be maintained at a level greater than 2.4V. As such, the selection of a safe voltage may vary depending on device characteristics and the amount of transient current possible during dynamic operation such as a mode change.

Due to this decrease in regulated voltage, the LDO adjusts, again increasing the regulated voltage node level to the 3.1V safe voltage level. After this safe voltage level is reached, control logic or another control mechanism can cause the LDO regulator to change its voltage level back to the normal operating level, namely the 3.8V level, as shown in FIG. 3.

As further seen in FIG. 3, similar operations to switch down to a safe voltage level can occur prior to one or more gain stages being switched off, leading to an upward rising glitch occurring as a result of the lowered current consumption.

Where upward and downward glitches are large enough to fit within an allowable voltage range, a single safe voltage can be chosen (e.g., at a midpoint voltage), as the maximum up glitch and the maximum down glitch would still be in the allowable range. However, in implementations in which at least one of the glitches would exceed this range, multiple safe voltages may be needed, e.g., one associated with an upward glitch and one associated with a downward glitch. In this way larger glitches can be tolerated if the maximum (safe) voltage is selected for a down glitch, and the minimum (safe) voltage is selected for an up glitch. Note however, that a glitch cannot allow the actual voltage to exceed the allowable range.

In an implementation with two safe voltages, the logic may include a decoder to generate a control signal to indicate which of the multiple safe voltages is to be generated. For example, to increase power output of the PA one or more gain stages may be powered on, causing a downward glitch, and thus a larger safe voltage may be selected. If instead a power level is decreased (e.g., one or more stages are to be turned off), the glitch is upwards and thus a smaller safe voltage is selected. In such implementations, the control signal (or an additional signal) provided by the control logic may indicate which of multiple safe voltages the voltage regulator should switch to.

While such implementations can tolerate larger glitches, a priori knowledge of which direction the glitch may occur is needed. In general, a single safe voltage may be more readily implemented, as state can be encoded in a single bit, e.g., a safe or safe signal. Further, circuitry (e.g., an analog portion of the voltage regulator) only needs two built-in settings. As one example, with a single safe voltage of 3.1V, a maximum positive glitch is 0.7V and a maximum negative glitch can be 0.7V, while with two safe voltages, a maximum glitch can be 1.4V.

Figure 4:
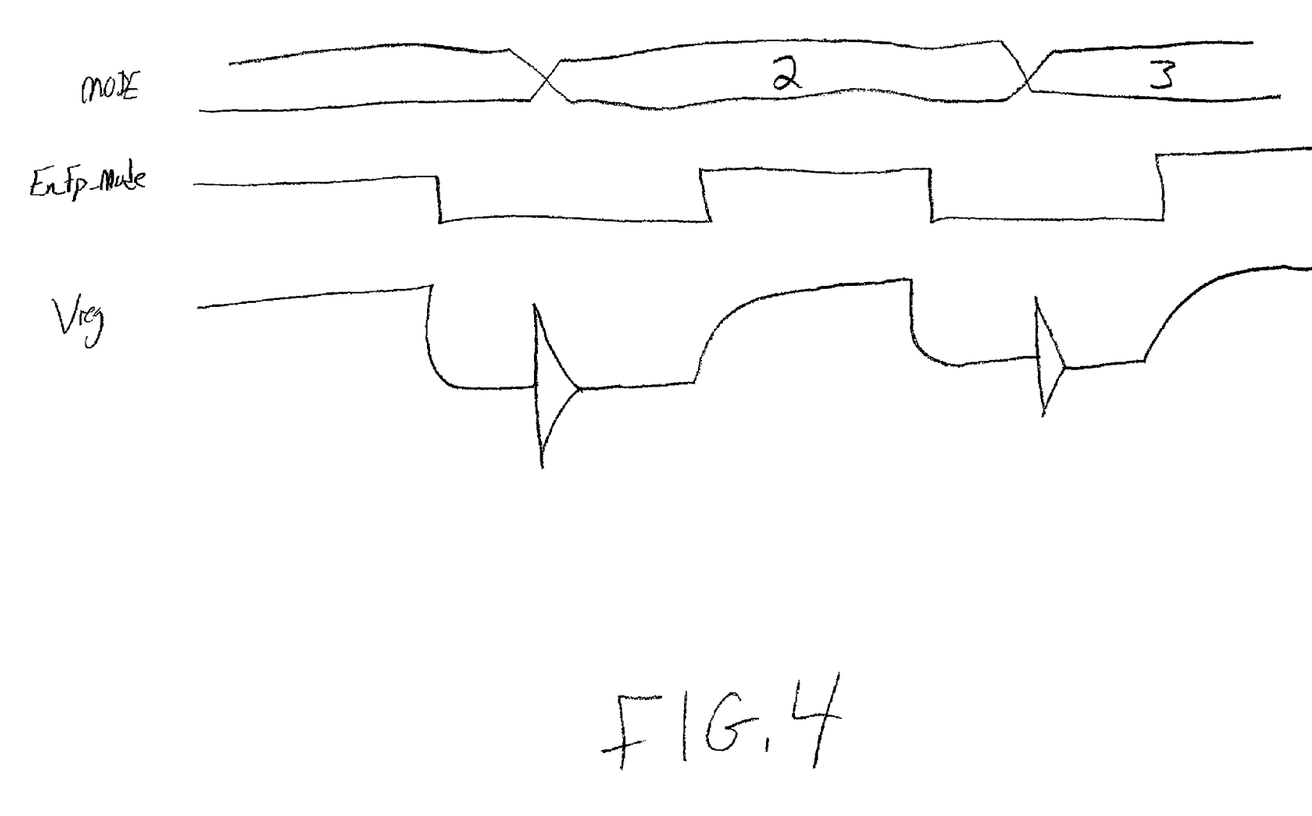
FIG. 4 is a timing diagram of various control signals in accordance with an embodiment of the present invention.

Referring now to FIG. 4, shown is a timing diagram of various control signals in accordance with an embodiment of the present invention, and their impact on a regulated voltage node value. As seen in FIG. 4, a mode select signal may be received, e.g., from off-chip. As shown in FIG. 4, this select signal instructs for two different mode changes to occur. In response to changes in this signal, an internal voltage control signal may be generated, namely En_Fp_Mode, which may be sent from control logic to a regulator to cause the regulator to output either its normal output level or a safe voltage. In one embodiment, when this voltage control signal is at a logic low level, the regulator outputs the safe voltage to enable withstanding of a glitch occurring due to a current change as a result of switching one or more gain stages in or out due to the mode switch instructed from off-chip. After the safe voltage is generated, the control logic can send a switch control signal to switch the selected gain stage(s) with regard to the output signal path, causing the glitch, which is then corrected by the regulator. Thereafter, the control logic can set the voltage control signal to the logic high level to return the regulated voltage to its normal regulation.

Figure 5:
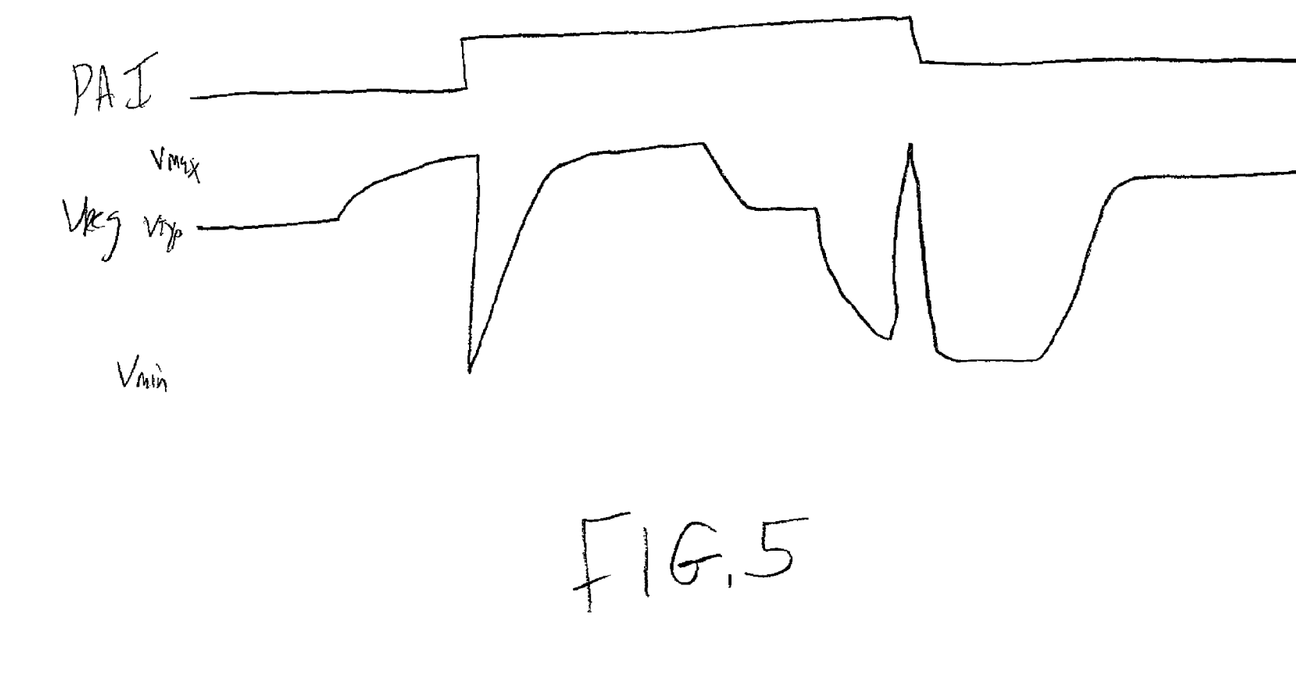
FIG. 5 is a graphical illustration of a voltage level at a regulated voltage node in accordance with another embodiment of the present invention.

Similar control of a regulated voltage within an allowable voltage range can be realized with multiple safe voltages, as discussed above. Referring now to FIG. 5, shown is a graphical illustration of a voltage level at a regulated voltage node in accordance with another embodiment of the present invention. As seen in FIG. 5, when a glitch is to occur at the regulated voltage node, the regulator output can be switched to a safe voltage level. However in the embodiment of FIG. 5, in contrast to that of FIG. 3, different safe voltage levels are provided, namely a maximum safe voltage level of 3.8V (i.e., a maximum safe voltage) and a second safe voltage level of 2.4V (i.e., a minimum safe voltage). As seen, the maximum safe voltage level may be used when increasing current consumption, causing a downward glitch, and the minimum safe voltage may be used when decreasing current consumption, causing an upward voltage glitch. In other respects, the operations performed in FIG. 5 may be similar to that discussed above regarding FIG. 3. Note that the typical operating voltage can be anywhere in the allowable range between the minimum safe voltage and the maximum safe voltage.

Figure 6:
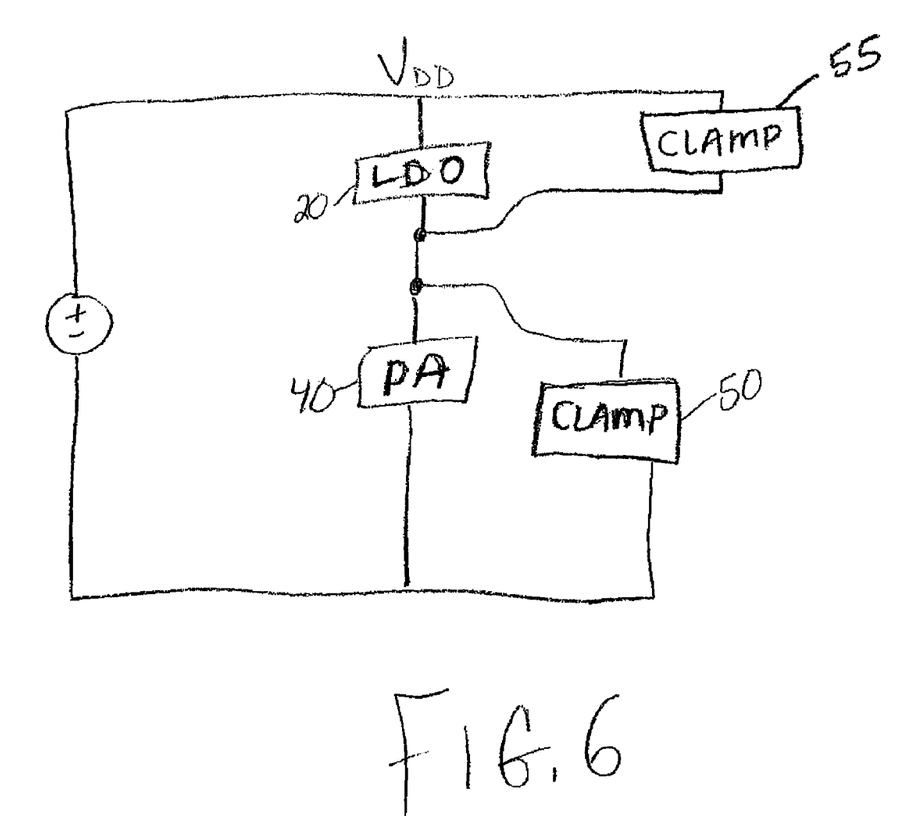
FIG. 6 is a schematic diagram of a circuit in accordance with another embodiment of the present invention.

Referring now to FIG. 6, shown is a schematic diagram of a circuit in accordance with another embodiment of the present invention. The circuit of FIG. 6 may generally correspond to that of FIG. 1, with the addition of further components to maintain a safe voltage during startup and standby conditions. As shown in FIG. 6, to keep the regulated voltage node in a safe range during power up and standby operations, a pull-up device which may be implemented as a clamp and a pull-down device which also may be implemented as a clamp may be provided. Specifically, as shown in FIG. 6, a first clamp 55 may be coupled in parallel with LDO 20 between supply voltage node $V_{DD}$ and the regulated voltage node. In turn, a second clamp 50 may be provided in parallel with PA gain stages 40. In one embodiment, the first clamp may be implemented as a NMOS device having a drain terminal coupled to $V_{DD}$ and a source terminal coupled to the regulated voltage node. In turn, its gate terminal may be coupled to receive a bias voltage. By controlling the bias voltage to the gate terminal of this NMOS, $V_{reg}$ may be maintained at least at a predetermined level, e.g., at a voltage greater than or equal to 3.0V (in the examples described above). In turn, clamp device 50, which may be a PMOS device having a source terminal coupled to the regulated voltage node, a drain terminal coupled to a ground voltage and a gate terminal coupled to the bias voltage may maintain this node to be no greater than 3.8V. In combination, these two devices may thus maintain the regulated voltage node to be within a safe range during power on and standby conditions. Clamp 55 may be formed of a larger device than clamp 50, as it is to handle a startup current for power on events.

In one embodiment, the gate-to-source voltage ($V_{gs}$) of clamp 55 can be fairly strong, whereas the drain terminal can swing freely. Thus as the gate voltage is moved down via the bias voltage $V_{bias}$, the source voltage will move with it, keeping the drain voltage stable. By applying a predetermined voltage as the bias voltage, the regulated voltage node may be kept at least at a certain value.

In general, the source voltage corresponding to the regulated voltage node $V_{reg}$ cannot go more than a threshold voltage below the bias voltage (although it can go above that) such that clamp 55 acts as a minimum function to protect LDO 20. In turn, clamp 50 is to ensure that the regulated voltage node does not go above a certain value (to protect gain stage 40).

In the embodiment of FIG. 6, when the PA is in standby (i.e., no gain stages are on), the LDO is off. In this case, the only thing that maintains the regulated voltage node in a safe range is the two clamps (generally, the pull-up device can also be referred to as a clamp). Note that the clamps may overlap, as the minimum value of one is less than the maximum of the other, such that there is a range of voltage levels possible although the LDO is off.

Figure 7:
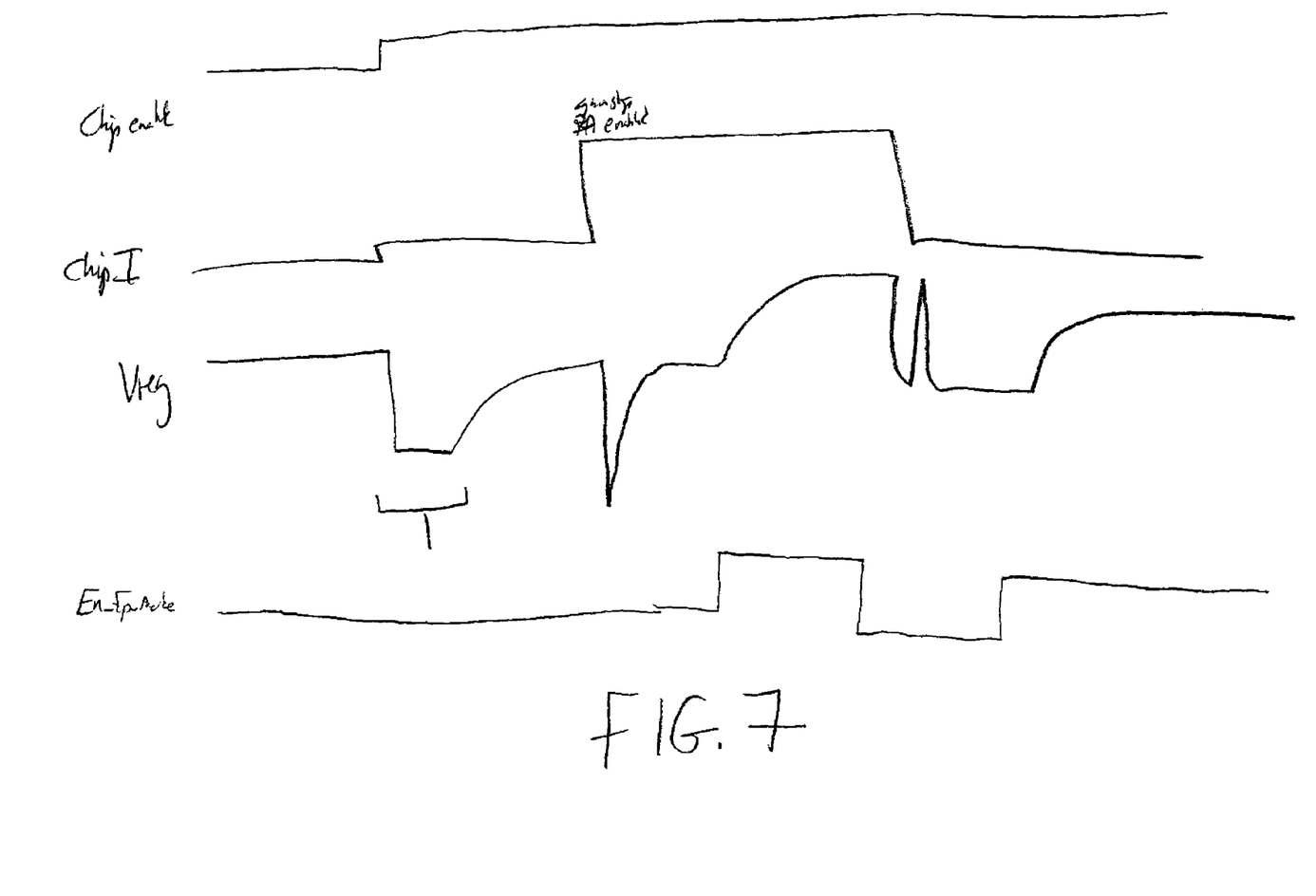
FIG. 7 is a timing diagram regarding switching operations with regard to standby in accordance with another embodiment of the present invention.

Referring now to FIG. 7, shown is a timing diagram regarding switching operations with regard to standby. On power up from a standby or power-off state, because the LDO is off it cannot transition the regulated voltage back and forth between a safe voltage. In this case, clamp device 55 ends up taking some of the current temporarily during the time when the LDO is powering up. Note that the waveform of FIG. 7 is nearly identical to that of FIG. 3. However, instead of transitioning down to the safe voltage as a smooth curve (e.g., shown in FIG. 3), the voltage immediately jumps down. This occurs because when the currents are turned on, the voltage node level is lowered and clamp device 55 holds the level. Thereafter the LDO is powered up and sets the voltage node to the safe voltage. Note further the presence of a chip enable control signal, as well as the voltage control signal, En_Fp_Mode.

Figure 8:
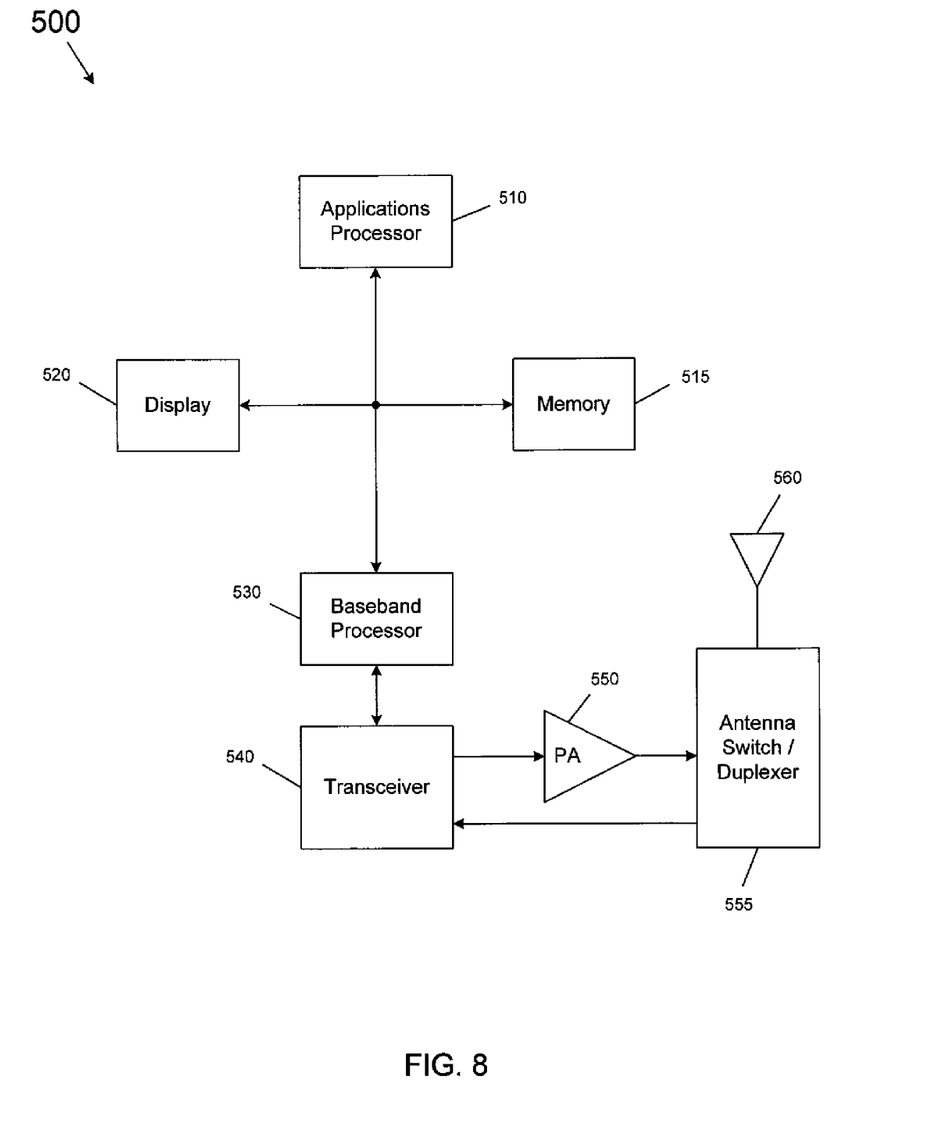
FIG. 8 is a block diagram of a wireless device in accordance with an embodiment of the present invention.

As described above, maintaining a safe voltage in the presence of transients in accordance with an embodiment of the present invention can be implemented in a PA such as a complementary metal-oxide-semiconductor (CMOS) PA. Such a device can be used in various wireless systems, including handsets, mobile devices, PDAs and so forth. Referring now to FIG. 8, shown is a block diagram of a wireless device 500 in accordance with an embodiment of the present invention, and which may be a 2G, 2.5G, 3G or 4G smart phone, for example. As shown in FIG. 8, wireless device 500 may include an applications processor 510 which may be a microprocessor or other programmable logic to handle various system features, such as running application programs desired by a user. To perform its functions, applications processor 510 may communicate with a memory 515, which may be a flash memory or other non-volatile memory. Applications processor 510 may further communicate with a display 520, such as an LCD display of the system. For handling RF communications, e.g., wireless phone calls, wireless data transmissions and so forth, e.g., according to a W-CDMA, OFDMA, or other protocol, applications processor 510 may communicate with a baseband processor 530, which may handle baseband operations both for transmit and receive paths. In turn, baseband processor 530 is coupled to a transceiver, which may receive incoming baseband signals from baseband processor 530, and perform processing to upconvert the signals to RF levels for transmission to a PA 550, and also instruct the PA regarding an output power level to be applied to the signals. PA 550 may be a power amplifier in accordance with an embodiment of the present invention that includes control logic or other circuitry to cause a regulated voltage to move to a safe level prior to switching gain stages into or out of an output signal path. In turn, PA 550 may be coupled to an antenna switch, duplexer or both 555 which in turn is coupled to an antenna 560, which radiates the amplified RF signal.

In a receive path, antenna 560 couples through antenna switch 555 and possibly through the duplexer or SAW filters and then to transceiver 540, which may demodulate the incoming RF signals back to baseband for transmission to baseband processor 530 for further processing. While shown with this particular implementation in the embodiment of FIG. 8, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a voltage regulator to receive a supply voltage at a supply voltage node and to output a regulated voltage to an intermediate node;
    an amplifier coupled to the intermediate node to be powered by the regulated voltage, the amplifier including a plurality of gain stages each controllable to be switched on or off during a transmission mode; and
    a control logic coupled to the voltage regulator to cause the voltage regulator to change the regulated voltage from a first voltage to a safe voltage before one or more of the gain stages is to be coupled to or decoupled from an output signal path.

2. The apparatus of claim 1, wherein the control logic is to receive a mode select signal from a transceiver coupled to the amplifier and responsive to the mode select signal to generate a first control signal to be provided to the voltage regulator to cause the voltage regulator to change the regulated voltage from a first value to a second value corresponding to the safe voltage.

3. The apparatus of claim 2, wherein the control logic is to thereafter generate a second control signal to be provided to the amplifier to cause a change in a number of the gain stages coupled to the output signal path.

4. The apparatus of claim 3, wherein the control logic is to thereafter generate a third control signal to be provided to the voltage regulator to cause the regulated voltage to be output at the first value.

5. The apparatus of claim 2, wherein the control logic is to generate the first control signal to cause the regulated voltage to change to a first safe voltage if the mode select signal requests an increase to a power output of the amplifier.

6. The apparatus of claim 5, wherein the control logic is to generate the first control signal to cause the regulated voltage to change to a second safe voltage if the mode select signal requests a decrease to a power output of the amplifier, wherein the second safe voltage is less than the first safe voltage.

7. The apparatus of claim 1, further comprising a first clamp device coupled in parallel to the voltage regulator between the supply voltage node and the intermediate node.

8. The apparatus of claim 7, further comprising a second clamp device coupled in parallel to the plurality of gain stages.

9. The apparatus of claim 8, wherein the first clamp device is to maintain the intermediate node at a level greater than a first predetermined voltage when the voltage regulator is in a standby mode.

10. The apparatus of claim 9, wherein the second clamp device is to maintain the intermediate node at a level less than a second predetermined voltage when the voltage regulator is in the standby mode, the second predetermined voltage corresponding to a maximum voltage of an allowable voltage range for the intermediate node.

11. A method comprising:
determining that a circuit powered by a voltage regulator will have a change in operating state that causes a change in current consumption;
responsive to the determination, changing a value of a regulated voltage output by the voltage regulator from a first value to a second value if an increase in the current consumption is to occur, and changing the value of the regulated voltage output to a third value if a decrease in the current consumption is to occur, wherein the second value is greater than the third value;
enabling the circuit to change the operating state, which causes a change to the second value of the regulated voltage; and
thereafter returning the regulated voltage to the first value.

12. The method of claim 11, wherein determining the change in operating state comprises receiving a mode select signal in a logic of a power amplifier from a transceiver coupled to the power amplifier, the mode select signal to instruct a change in a power mode for the power amplifier.

13. The method of claim 12, further comprising sending a first control signal from the logic to the voltage regulator to cause a change in the value of the regulated voltage.

14. The method of claim 13, further comprising sending a second control signal from the logic to a gain stage to switch at least one amplifier stage into or out of a signal path of the power amplifier, the second control signal transmitted after the regulated voltage output changes to the second value.

15. The method of claim 14, further comprising sending a third control signal from the logic to the voltage regulator to cause the value of the regulated voltage to return to the first value.

16. A system comprising:
a transceiver to communicate a radio frequency (RF) signal to a power amplifier (PA) and to send a mode select signal to the PA to cause transmission of the RF signal at a desired level; and
the PA coupled to the transceiver and including:
a voltage regulator to receive a supply voltage at a supply voltage node and to output a regulated voltage to an intermediate node;
a plurality of gain stages coupled to the intermediate node to be powered by the regulated voltage, each of the gain stages controllable to be switched on or off during a transmission mode;
a control logic coupled to the voltage regulator to cause the voltage regulator to change the regulated voltage from a first voltage to a safe voltage before one or more of the gain stages is to be switched on or off;
a first clamp device coupled in parallel to the voltage regulator between the supply voltage node and the intermediate node; and
a second clamp device coupled in parallel to the plurality of gain stages.

17. The system of claim 16, wherein the control logic is to send a first control signal to the voltage regulator to cause the voltage regulator to change the regulated voltage.

18. The system of claim 17, wherein the control logic is to send a second control signal to a first gain stage to switch the first gain stage on, the second control signal transmitted after the regulated voltage output changes to the safe voltage.

19. The system of claim 18, wherein the control logic is to send a third control signal to the voltage regulator to cause the value of the regulated voltage to return to the first voltage.

20. The system of claim 17, wherein the first control signal indicates that the safe voltage is to be a selected one of a plurality of safe voltages based on the mode select signal, wherein the selected safe voltage is to be in a first direction from the regulated voltage if at least one gain stage is to be switched on, and to be in a second direction from the regulated voltage if at least one gain stage is to be switched off.

* * * * *